United States Patent [19]

Seely et al.

[11] Patent Number: 4,992,761
[45] Date of Patent: Feb. 12, 1991

[54] PASSIVE 180 DEGREE BROADBAND MMIC HYBRID

[75] Inventors: Warren L. Seely; Joseph Staudinger, both of Chandler, Ariz.

[73] Assignee: Motorola, Inc., Schaumburg, Ill.

[21] Appl. No.: 453,204

[22] Filed: Dec. 26, 1989

Related U.S. Application Data

[63] Continuation-in-part of Ser. No. 319,037, Mar. 6, 1989, abandoned.

[51] Int. Cl.⁵ .............................................. H03H 7/48
[52] U.S. Cl. ...................................... 333/118; 333/120; 333/138; 333/156
[58] Field of Search ............... 333/117, 118, 123, 138, 333/156, 160, 161, 120; 455/325-327

[56] References Cited

U.S. PATENT DOCUMENTS

| | | | |
|---|---|---|---|
| 2,639,325 | 5/1953 | Lewis | 333/120 |
| 3,229,233 | 1/1966 | Pon | 333/120 |
| 3,419,823 | 12/1968 | Seidel | 333/117 |
| 3,681,697 | 8/1972 | Moroney | 455/326 X |

FOREIGN PATENT DOCUMENTS

| | | | |
|---|---|---|---|
| 101641 | 8/1979 | Japan | 333/118 |
| 43412 | 2/1988 | Japan | 333/117 |

*Primary Examiner*—Paul Gensler
*Attorney, Agent, or Firm*—Jordan C. Powell

[57] ABSTRACT

A passive 180 degree MMIC (monolithic microwave integrated circuit) hybrid is developed which yields broad band widths, decreases the circuit surface area to increase production yield, and is compatible with GaAs (gallium arsenide) media used in MMIC circuits. The passive 180 degree MMIC hybrid comprises a in-phase combiner coupled to a delay transmission line through a plurality of adjusting capacitors. The coupling points of the in-phase combiner and the delay transmission line are further coupled to respective 180 degree hybrid outputs. A 0/180 input is coupled in common to the delay transmission line. The 90 degree hybrid comprises a plurality of transmission lines coupled to a 0/0 input of the 180 degree hybrid.

10 Claims, 2 Drawing Sheets

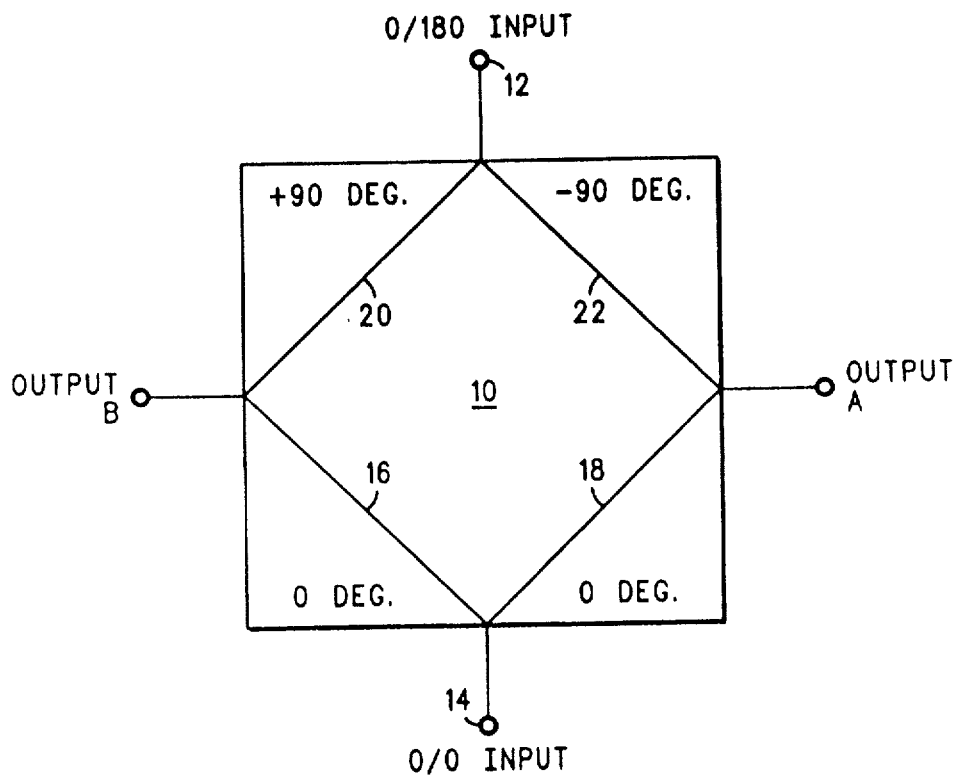
FIG. 1
FIG. 2
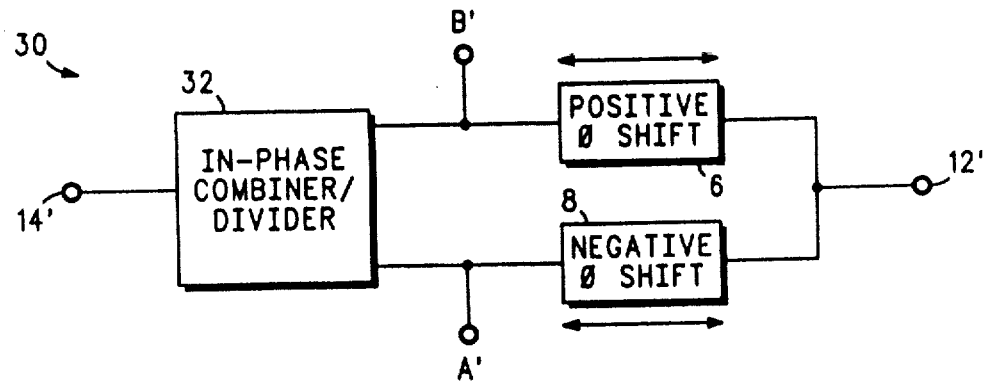

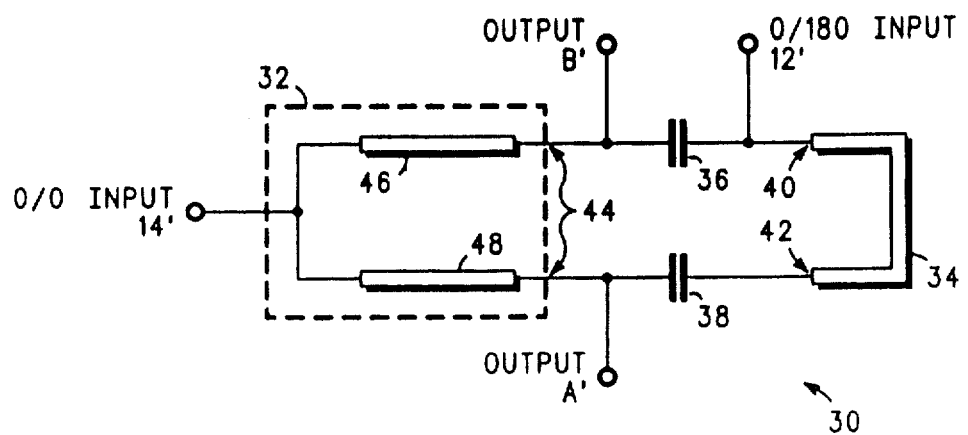
FIG. 3
FIG. 4
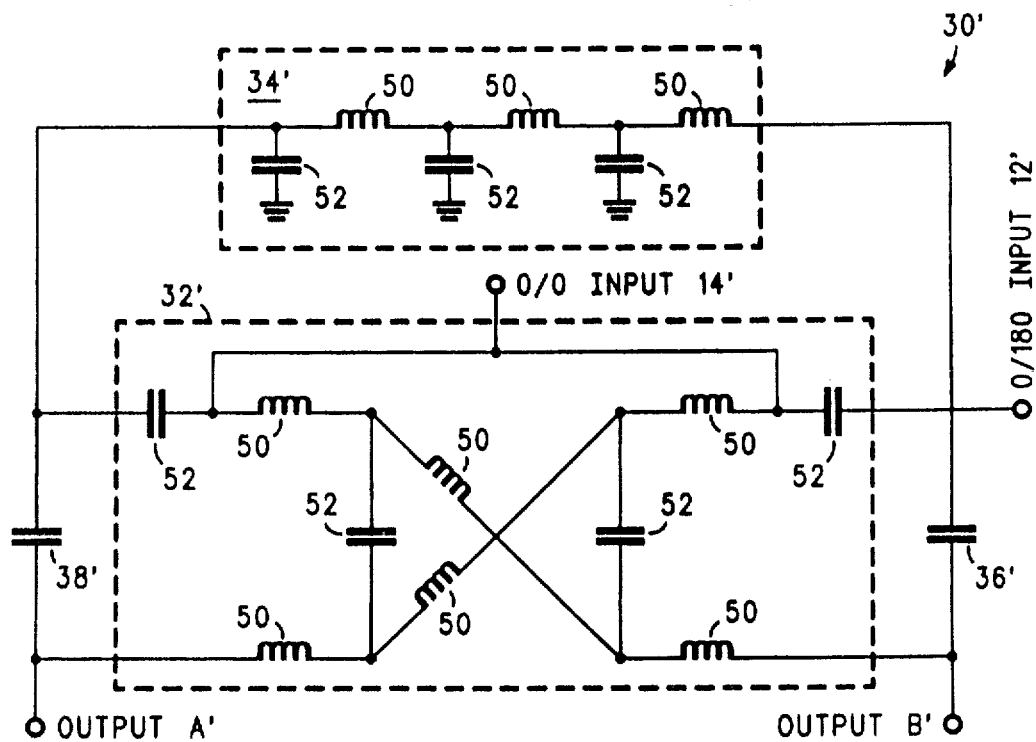

4,992,761

PASSIVE 180 DEGREE BROADBAND MMIC HYBRID

This is a continuation-in-part of application Ser. No. 319,037, filed Mar. 6, 1989, abandoned.

BACKGROUND OF THE INVENTION

This invention relates, to general, to microwave hybrids for use in Monolithic Microwave Integrated Circuits (MMIC), and more specifically, to 180 degrees broadband MMIC hybrids.

One hundred-eighty degree hybrids are common elements found in mixers which modulate RF (radio frequency) input signals with signals from local oscillators to output IF (intermediate frequency) signals. One hundred-eighty degree hybrids are further used in a variety of circuits as basic circuit elements. There are many types of 180 degree hybrids for use in the frequencies up to the low megahertz range. Such hybrids use various methods of construction such as the Marchand Balun hybrids, and often incorporate ferrite elements to obtain bandwidth performance. However, hybrids constructed by such conventional methods are not usable with microwave circuits, or they are limited to extremely high frequencies (above 25 GHz), particularly when incorporated on GaAs (Gallium Arsenide) media for MMIC circuits. Additionally, ferrite cannot be used on MMIC circuits. MMIC circuits are suited to lumped and distributed elements due to the extremely small circuit area inherent with GaAs media. Those 180 degree hybrid MMIC circuits which have been constructed with lumped elements have, thus far, been limited to very narrow bandwidths (less than 5-10%), and suffer in both phase and amplitude performance.

SUMMARY OF THE INVENTION

Accordingly, it is an object of the present invention to provide a passive 180 degree hybrid which is compatible with GaAs MMIC circuitry.

Another object of the present invention is to provide a passive 180 degree hybrid which provides broad bandwidths in the microwave frequencies.

A further object of the present invention is to provide a passive 180 degree hybrid which incorporates lumped elements within the circuitry to decrease the surface area used on a GaAs media, and thus increase yield.

To achieve the above objects, a passive 180 degree MMIC hybrid is contemplated comprising an in-phase combiner coupled to delay transmission line through a plurality of adjusting capacitors. The coupling points of the in-phase combines and the delay transmission line are further coupled to respective 180 degree hybrid outputs. A 0/180 input is coupled in common to the delay transmission line. The in-phase combines comprises a plurality of transmission lines coupled at a 0/0 input of the 180 degree hybrid.

The above and other objects, features, and advantages of the present invention will be better understood from the following detailed description taken in conjunction with the accompanying drawings.

BRIEF DESCRIPTION OF THE DRAWING

FIG. 1 is a schematic diagram of the basic operation of a 180 degree hybrid.

FIG. 2 is a schematic diagram of a passive 180 degree hybrid according to the present invention.

FIG. 3 shows the various elements of the passive 180 degree hybrid of FIG. 2 according to the present invention.

FIG. 4 is a detailed schematic diagram of the passive 180 degree hybrid of FIG. 3 showing its lumped element construction according to the present invention.

DETAILED DESCRIPTION OF THE INVENTION

FIG. 1 shows the general operation of a 180 degree hybrid 10. Hybrid 10 comprises 0/180 input 12 0/0 input 14, and outputs A and B. If a RF (radio frequency) signal is input at 0/0 input 14, the signal is split and relayed to outputs A and B with each split portion of the signal equally shifted in phase at outputs A and B as indicated by 0 degree shift lines 16 and 18. Therefore, the output signals at outputs A and B are in phase with each other. When a RF signal is input at 0/180 input 12, the signal is split and relayed to output A and B. The two portions of the signal are not equally shifted in phase, but have a resultant 180 degree phase difference as indicated by shift lines 20 and 22, with the first portion (−90 degree shifted) output at A and the second split portion (+90 degree shifted) output at B.

Many 180 degree hybrid have been constructed to operate according to FIG. 1 in frequencies ranging up to the low magazine range with adequate resultant performances. However, in the microwave range of frequencies, very few 180 degree hybrid have performed successfully. Even the successful microwave hybrids have been limited to very narrow bandwidths. There is even less success with microwave 180 degree hybrids when the hybrids are incorporated on a GaAs (Gallim Arsenide) base for incorporation in MMIC (Monolithic Microwave Integrated Circuits) technology. Most research in the GaAs MMIC hybrids has focussed on active element hybrids. The lack of success with GaAs MMIC active element hybrids has led to the passive hybrid of the present invention.

FIG. 2 shows a passive 180 degree hybrid 30 according to the present invention, which comprises in-phase section 32, combiner positive phase shift 6, and negative phase shift 8. Hybrid 30 further comprises 0/180 input 12', 0/0 input 14', and outputs A' and B' corresponding to the respective inputs and outputs of FIG. 1. A first terminal of in-phase combiner section 32 is coupled to a terminal of positive phase shift 6 and to output B', and a second terminal of in-phase combines section 32 is coupled to a terminal of negative phase shift 8 and to output A'. Zero/one hundred-eighty degree input 12' is coupled to positive phase shift 6 and negative phase shift 8, whereas 0/0 input 14' is coupled to in-phase combiner section 32.

A signal passed from input 14' through positive phase shift 6 will be shifted in phase, in this preferred embodiment +45 degrees. A signal passing from input 14' through negative phase shift 8 will be shifted in phase −135 degrees. The two split signals are output then with a 180 degrees phase differential.

FIG. 3 shows the various elements of passive 180 degree hybrid 30 of FIG. 2 in its preferred embodiment.

Zero degree hybrid section 32 includes transmission lines 46 and 48 coupled to 0/0 input 14'. Transmission lines 46 and 48 are coupled to plurality of terminals 44.

Negative phase shift 8 and positive phase shift 6 of FIG. 2 are shown in FIG. 3 as delay transmission line 34, and adjusting capacitors 36 and 38. Adjusting capacitor 36 represents positive phase shift 6, whereas adjusting capacitor 38 and delay transmission line 34 represent negative phase shift 8. Delay transmission line 34 is coupled on a first terminal 40 in common with 0/180 input 12', and further with adjusting capacitor 36. Terminal 42 of delay transmission line 34 is coupled in series with adjusting capacitor 38 and output A'. Adjusting capacitor 36 is coupled to output B'. Outputs A' and B' are coupled to plurality of terminals 44 of in-phase combiner section 32.

When a RF signal is input at 0/0 input 14', the signal is split, and the two split signals are transmitted along transmission lines 46 and 48 to outputs A' and B' where they are output in phase with each other. Any residual signal from output A' is shifted in phase as it passes through adjusting capacitor 38 and delay transmission line 34. When this shifted signal is received at 0/180 input 12', it is combined with the residual signals from output B' which have been received through adjusting capacitor 36. At this point, the two residual signals are 180 degrees out of phase and cancel, thus supplying isolation to 0/180 input 12'.

When a RF signal is input at 0/180 input 12', the signal is split. A first portion of the split signal passes through capacitor 26 and is output at output B' at a given phase angle $\phi+45°$. The second portion of the split signal is transmitted through delay transmission line 34 and adjusting capacitor 38, and output at output A'. This second portion of the split signal at output A' has a phase angle $\phi-135$. The $\phi+45°$ shift largely result from adjusting capacitor 36, and the $\phi-135°$ shift largely results from delay transmission line 34 and adjusting capacitor 28 but both phase shifts are dependent upon the interaction of the other components of hybrid 30. The differential angle between the two signals is then $(\phi-135°)-(\phi+45°)=180°$. The length of delay line 34 to result in a $\phi-135°$ phase shift when coupled with adjusting capacitor 38 is empirically determined depending upon the following variables: bandwidth, frequency, and the topology of delay line 34. Delay line 34 will generally be approximately one-quarter wave length. Transmission lines 46 and 48 will also be approximately one-quarter wave length. Residual signals from output B' received at 0/0 input 14' are cancelled with residual signals from output A' since the two signals are 180 degrees out of phase. The yields isolation at 0/0 input 14'. Residual signals from output B' not received at 0/0 input 14' are received at output A' having a phase angle of $\phi+180°$ since the signal passed through both transmission line 46 and 48 of in-phase combiner 32. This signals is output at output A'. Similarly, residual signals from output A' which are not received at 0/0 input 14' are output at output B' with a phase angle of $\phi$, having passed through both transmission lines 46 and 48 of in-phase combiner 32.

Adjusting capacitors 36 and 38 adjust the split portions of the RF signal to the required output amplitudes.

FIG. 4 shows the schematic of FIG. 3 in lumped element construction comprising delay transmission line 34', in-phase combiner section 32', and adjusting capacitors 36' and 38'. In FIG. 4, the transmission lines of passive 180 degree hybrid 30' (transmission line 34' of FIG. 4 and transmission line 46 and 48 of FIG. 3 shown in FIG. 4 only as in-phase combiner 32'), in their preferred embodiments, comprise inductors 50 and capacitors 52 constructed as low pass filters. It should be recognized that transmission lines 34, 46, 48 may be constructed in other filter manners such as high pass or band pass filters.

The broad bandwidth of passive 180 degree hybrid 30 is a result of first, the nature of lumped element construction, and second, the construction of the hybrid itself with its connections and interconnections.

Thus there has been provided, in accordance with the present invention, a passive 180 degree hybrid that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:
1. A 180 degree hybrid comprising:
   a first input to receive an RF signal;
   means for splitting said RF signal coupled to said first input;
   positive phase shift means for shifting a first of said split signals in phase approximately +45 degrees;
   negative phase shift means for shifting a second of said split signals in phase approximately −135 degrees;
   said negative phase shift means comprising a transmission line and a capacitive element;
   said positive phase shift means and said negative phase shift means coupled to said means for splitting;
   said positive phase shift means and said negative phase shift means further coupled to first and second outputs, respectively;
   said transmission line and said capacitive element coupled in series between said positive phase shift means and said second output; and
   a means for isolating said split signals, said means for isolating coupled to said first and second outputs.
2. A 180 degree hybrid according to claim 1 wherein said isolation means comprises:
   first and second transmission lines;
   said first and second transmission lines coupled to said first and second outputs respectively; and
   said first and second transmission lines coupled to a second input.
3. A 180 degree hybrid comprising:
   a first input to receive an RF signal;
   means for splitting said RF signal coupled to said first input;
   positive phase shift means for shifting a first of said split signals in phase approximately +45 degrees;
   negative phase shift means for shifting a second of said split signals in phase approximately −135 degrees;
   said positive phase shift means comprising a capacitive element;
   said positive phase shift means and said negative phase shift means coupled to said means for splitting;
   said positive phase shift means and said negative phase means further coupled to first and second outputs, respectively;
   said capacitive element coupled between said negative phase shift means and said first output; and
   a means for isolating said split signals, said means for isolating coupled to said first and second outputs.
4. A broadband hybrid comprising:
   an in-phase combiner/divider;

first lumped element phase shift means comprising a capacitor coupled to a first port of said in-phase combiner divider, second lumped element phase shift means coupled to a second port of said in-phase combiner;

an input coupled to said capacitor and to said second lumped element phase shift means;

said input splitting an input RF signal between said capacitor and said second lumped element phase shift means;

said capacitor and said second lumped element phase shift means creating a 180° phase differential between said split input signals; and said capacitor and said second lumped element phase shift means coupled to first and second outputs, respectively.

5. A broadband hybrid according to claim 4 wherein said capacitor supplies a 45 degree phase shift in a first of said split RF signals.

6. A broadband hybrid according to claim 4 wherein said second lumped element phase shift means comprises means for supplying a negative 135 degree phase shift in one of said split RF signals.

7. A broadband hybrid according to claim 6 wherein said second lumped element phase shift means comprises:
  a quarter-wave length delay line;
  a capacitor; and
  said quarter-wave length delay line and said capacitor coupled in series between said input and one of said plurality of outputs.

8. A broadband hybrid comprising:
  an in-phase combiner;
  first lumped element phase shift means coupled to a first port of said in-phase combiner;
  second lumped element phase shift means including a quarter-wave length delay line and a capacitor;
  said capacitor coupled to a second port of said in-phase combiner;
  said quarter-wave length delay line coupled to said capacitor;
  an input coupled to said first lumped element phase shift means and to said quarter-wave length delay line;
  said input splitting an input RF signal between said first lumped element phase shift means and said quarter-wave length delay line;
  said second lumped element phase shift means supplying a negative 135 degree phase shift in a first of said split input RF signals;
  said first and second lumped element phase shift means creating a 180° phase differential between said split input signals; and
  said first and second lumped element phase shift means coupled to first and second outputs respectively.

9. A broadband hybrid according to claim 8 wherein said first lumped element phase shift means comprises a capacitor.

10. A broadband hybrid according to claim 8 wherein said first lumped element phase shift means comprises means for supplying approximately a 45 degree phase shift in one of said split RF signals.

* * * * *